United States Patent
Xu et al.

(10) Patent No.: US 10,122,294 B2
(45) Date of Patent: Nov. 6, 2018

(54) ACTIVE GATE CLAMPING FOR INVERTER SWITCHING DEVICES WITH ENHANCED COMMON SOURCE INDUCTANCE

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US); Michael W. Degner, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 108 days.

(21) Appl. No.: 15/366,266

(22) Filed: Dec. 1, 2016

(65) Prior Publication Data

US 2018/0159440 A1 Jun. 7, 2018

(51) Int. Cl.
*H02M 7/537* (2006.01)
*H02M 1/32* (2007.01)
*H02M 1/08* (2006.01)
*H02M 1/38* (2007.01)
*H02M 7/00* (2006.01)
(Continued)

(52) U.S. Cl.
CPC ............. *H02M 7/537* (2013.01); *H02M 1/08* (2013.01); *H02M 1/32* (2013.01); *H02M 1/38* (2013.01);
(Continued)

(58) Field of Classification Search
CPC ............ H02M 1/32; H02M 1/38; H02M 7/48; H02M 7/51; H02M 7/538; H02M 7/5387;
(Continued)

(56) References Cited

U.S. PATENT DOCUMENTS

| 6,097,582 A | 8/2000 | John et al. |
| 6,992,520 B1 | 1/2006 | Herbert |

(Continued)

FOREIGN PATENT DOCUMENTS

DE 19938302 A1 2/2000

OTHER PUBLICATIONS

Developing IGBT application using an TD350 advanced IGBT driver, AN1944 Application note, © 2006 STMicroelectronics, pp. 1-21, Oct. 2006.

(Continued)

*Primary Examiner* — Kyle J Moody
*Assistant Examiner* — Kevin H Sprenger
(74) *Attorney, Agent, or Firm* — David B. Kelley; MacMillan, Sobanski & Todd, LLC

(57) ABSTRACT

An inverter phase leg has upper and lower gate drive circuits supplying gate drive signals to upper and lower transistors. Each gate drive circuit includes an active clamp for selectively deactivating the upper and lower transistors. The transistors are comprised of semiconductor devices, each having respective gate, source, and emitter terminals. Each emitter terminal is connected to a respective output electrode structured to enhance a common source inductance between the respective gate and emitter terminals. Each emitter terminal is further connected to a respective Kelvin emitter electrode substantially bypassing the respective output electrode. Each respective active clamp is connected between the respective gate terminal and Kelvin emitter electrode so that the active clamping function remains effective in the presence of the enhanced common source inductance.

20 Claims, 7 Drawing Sheets

(51) Int. Cl.
*H02M 7/5387* (2007.01)
*H02M 1/34* (2007.01)

(52) U.S. Cl.
CPC ......... *H02M 7/003* (2013.01); *H02M 7/5387* (2013.01); *H02M 2001/342* (2013.01)

(58) Field of Classification Search
CPC ............. H02M 7/003; H02M 7/53871; H02M 7/53875; H02M 7/53803; H02M 7/53806; H02M 7/537; H02M 7/53835; H02M 7/5381; H02M 7/53846; H02M 3/3376; H02M 3/33507; H02M 3/33523; H02M 3/3384; H02J 3/382; H02H 7/1209; H02H 7/122; H02H 7/1227; H01F 2029/143; H01F 29/14; H01F 38/06; Y02B 70/1433; Y02B 70/1441
USPC ........ 363/55–56.04, 75, 95, 97–98, 131–134
See application file for complete search history.

(56) References Cited

U.S. PATENT DOCUMENTS

| | | | |
|---|---|---|---|
| 7,492,138 B2 | 2/2009 | Zhang et al. | |
| 8,085,083 B2 | 12/2011 | Zhang et al. | |
| 8,760,218 B2 | 6/2014 | Zhu | |
| 8,970,265 B2* | 3/2015 | McIntosh | H02M 1/08 327/112 |
| 2013/0033909 A1* | 2/2013 | Jones | H03K 17/0812 363/56.01 |
| 2013/0256746 A1* | 10/2013 | Nakamura | H01L 27/0647 257/140 |
| 2014/0321178 A1 | 10/2014 | Cyr et al. | |
| 2015/0003133 A1* | 1/2015 | Ogawa | H03K 17/168 363/132 |
| 2016/0087622 A1* | 3/2016 | Kaeriyama | H03K 17/0828 327/109 |
| 2016/0133597 A1* | 5/2016 | Kouno | H01L 23/4334 257/139 |
| 2016/0313191 A1* | 10/2016 | Sundaramoorthy | G01K 7/01 |
| 2017/0047320 A1* | 2/2017 | Naito | H01L 21/822 |

OTHER PUBLICATIONS

Yang, Bo and Jason Zhang, "Effect and utilization of common source inductance in synchronous rectification." Twentieth Annual IEEE Applied Power Electronics Conference and Exposition, 2005. APEC 2005, vol. 3. IEEE, 2005.

* cited by examiner

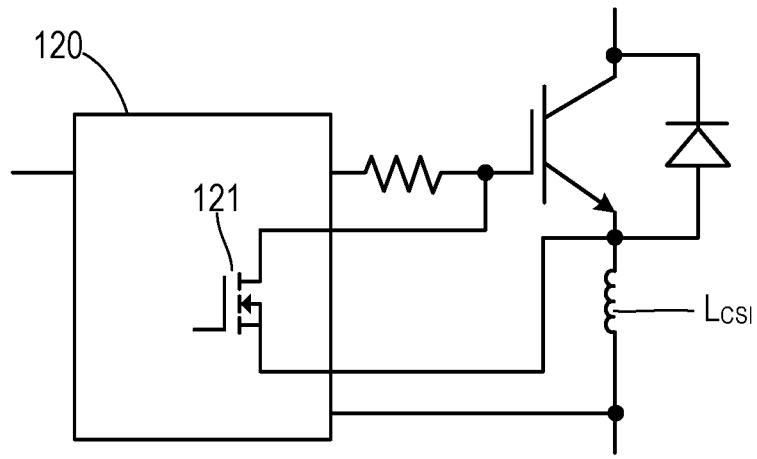
Fig. 14
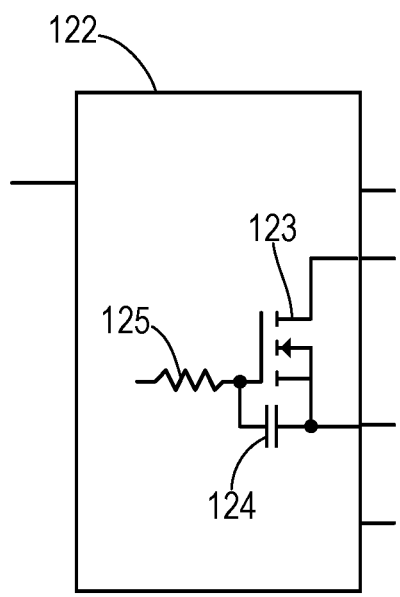 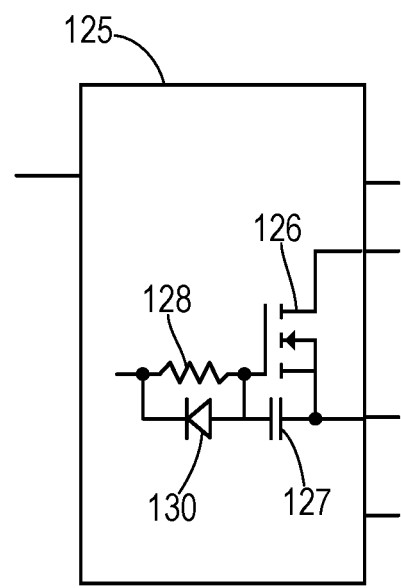
Fig. 15                Fig. 16

ACTIVE GATE CLAMPING FOR INVERTER SWITCHING DEVICES WITH ENHANCED COMMON SOURCE INDUCTANCE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power switching devices in an inverter bridge, and, more specifically, to active gate clamping to avoid unintended activations of power switching devices in an inverter.

Electric vehicles, such as hybrid electric vehicles (HEVs), plug-in hybrid electric vehicles (PHEVs), and battery electric vehicles (BEVs), use inverter-driven electric machines to provide traction torque. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. A typical configuration includes a three-phase motor driven by an inverter with three phase legs. An electronic controller turns the switches on and off to invert a DC voltage from the bus to an AC voltage applied to the motor. The inverter typically pulse-width modulates the DC link voltage to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Because each phase leg of the inverter has a pair of upper and lower switching transistors connected across the DC link, it is important that both devices in a leg not be conducting (i.e., turned-on) simultaneously. A short time interval (known as dead-time) is typically inserted in the PWM switching signals during which both the upper and lower switching devices of a phase leg are turned off in order to prevent "shoot-through" between the positive and negative buses. Due to electrical noise and magnetic coupling between the electrical components and signal paths of the gate inputs of the transistors, care must be taken to avoid inadvertent turning on of a transistor when its gate drive signal is intended to be off. Active clamping is sometimes used, wherein a clamp connected across the gate is activated to ensure that the switching transistor stays off.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain to source current) and the gate charging/discharging current. A current in the output (power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition, as long as other potential side effects are contained. For example, the presence of a large common source inductance could interfere with the operation of a conventional active clamp.

SUMMARY OF THE INVENTION

In one aspect of the invention, an inverter comprises a phase leg having series-connected upper and lower transistors adapted to be connected between positive and negative DC buses. Upper and lower gate drive circuits supply gate drive signals to the upper and lower transistors, respectively. Each gate drive circuit includes an active clamp for deactivating the upper and lower transistors, respectively. The transistors are comprised of semiconductor devices, each having respective gate, source, and emitter terminals. Each emitter terminal is connected to a respective output electrode structured to enhance a common source inductance between the respective gate and emitter terminals. Each emitter terminal is further connected to a respective Kelvin emitter electrode substantially bypassing the respective output electrode. Each respective active clamp is connected between the respective gate terminal and Kelvin emitter electrode so that the active clamping function remains effective in the presence of the enhanced common source inductance.

BRIEF DESCRIPTION OF THE DRAWINGS

FIG. 14 is a schematic diagram showing an IGBT and driver circuit with a typical clamping MOSFET.

FIG. 15 is a schematic diagram showing one preferred embodiment of a driver circuit with an improved clamping circuit.

FIG. 16 is a schematic diagram showing another preferred embodiment of a driver circuit.

DETAILED DESCRIPTION OF PREFERRED EMBODIMENTS

Figure 1:
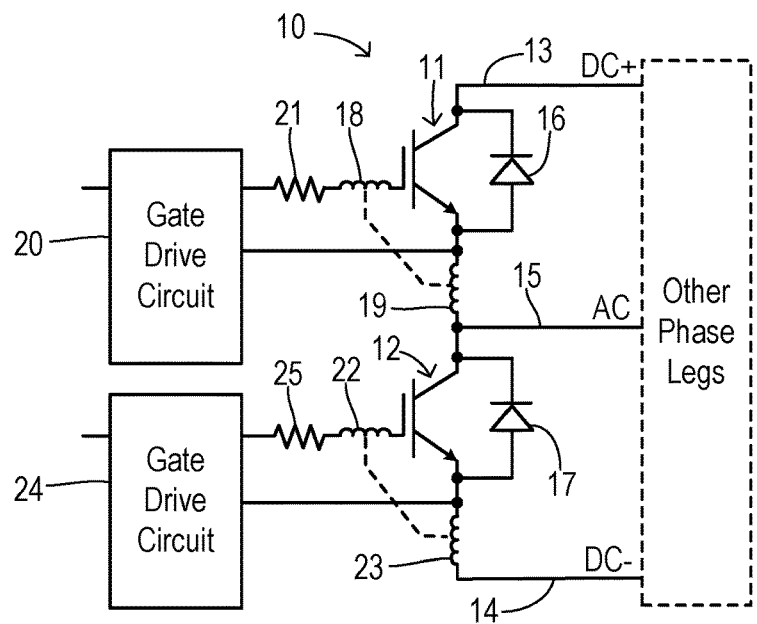
FIG. 1 is a schematic diagram showing an equivalent circuit for a phase leg of an inverter having a pair of IGBTs giving rise to a common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 1 shows an example of a phase leg 10 of the type often used in an inverter drive system in an electrified vehicle for driving an electric motor, wherein an upper transistor 11 is shown as an IGBT with upper gate, collector, and emitter terminals. Other types of semiconductor devices could be used, such as a MOSFET. As used herein, the gate, collector, and emitter terminals of an IGBT also refer to gate, drain, and source terminals of a MOSFET. A lower transistor 12 has lower gate, collector, and emitter terminals is connected in series with upper transistor 11 between a positive bus 13 and a negative bus 14 to define an intermediate junction 15. Anti-parallel diodes 16 and 17 are connected across transistors 11 and 12.

The upper gate and emitter terminals create an upper common source inductance comprised of a gate loop inductance 18 magnetically coupled to a power loop (i.e., emitter-side) inductance 19. A gate drive circuit 20 and a gate resistor 21 are coupled to the gate terminal in order to control the switching of upper transistor 11. The lower gate and emitter terminals create a lower common source inductance comprised of a gate loop inductance 22 magnetically coupled to a power loop inductance 23. A gate drive circuit 24 and a gate resistor 25 are coupled to the gate terminal in order to control the switching of lower transistor 12.

The coupling between a power loop and a gate loop can sometimes create undesirable interactions in which changes in the output current from a device causes changes in the gate signal which is attempting to control the device. Therefore, typical design rules used during development of transistor device packaging and circuits using such devices have aimed to minimize the common source inductance.

Figure 2:
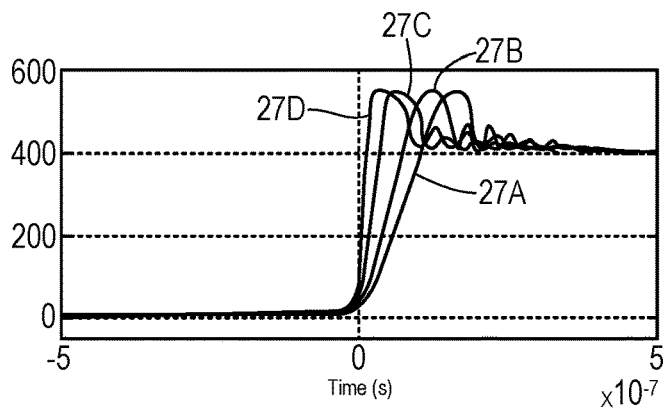
FIGS. 2 and 3 are graphs showing changes in output voltage spike and switching energy, respectively, for varying levels of common source inductance.
Figure 3:
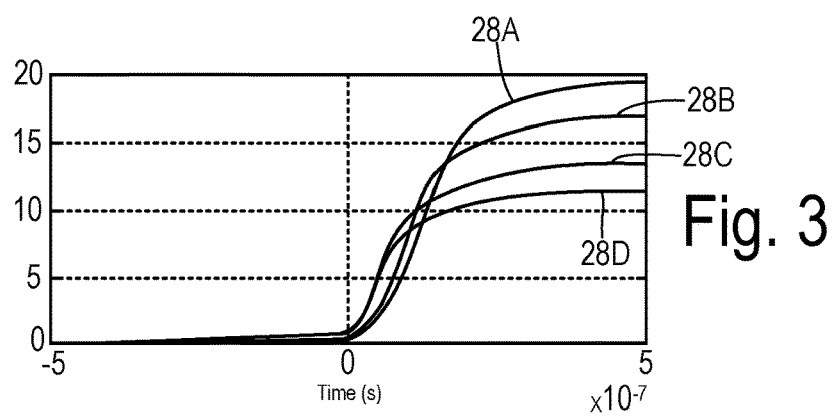

For a transistor in a phase leg, the influence of the magnitude of the common source inductance on the switching time and voltage overshoot is shown in FIG. 2 which depicts the changing collector to emitter voltage ($V_{CE}$) across a transistor over time during a transition from the ON state to the OFF state. Traces 18A, 18B, 18C, and 18D correspond to a common source inductance ($L_{CSI}$) of 0 nH, 1 nH, 2 nH, and 3 nH, respectively. Thus, as $L_{CSI}$ increases from 0 to 3 nH, the switching time is favorably reduced while the size of the voltage overshoot or spike remains substantially constant. However, the reduced switching time leads to lower energy loss (i.e., increased efficiency) as shown in FIG. 3. Traces 19A, 19B, 19C, and 19D correspond to an $L_{CSI}$ of 0 nH, 1 nH, 2 nH, and 3 nH, respectively. Thus, as $L_{CSI}$ increases from 0 to 3 nH, the energy consumed in the transistor drops from almost 19 mJ to about 11 mJ. Therefore, it has been recognized that a higher $L_{CSI}$ can reduce switching loss while keeping the same voltage spikes.

Figure 4:
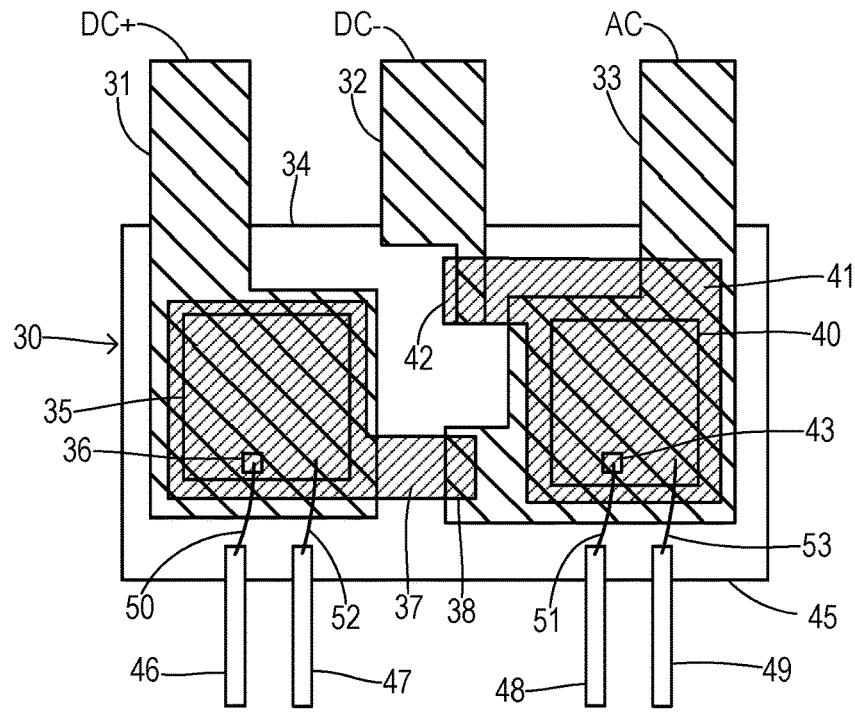
FIG. 4 is a plan view of a transfer-molded power module (TPM) having a pair of IGBTs and an electrode structure for minimizing common source inductance.
Figure 5:
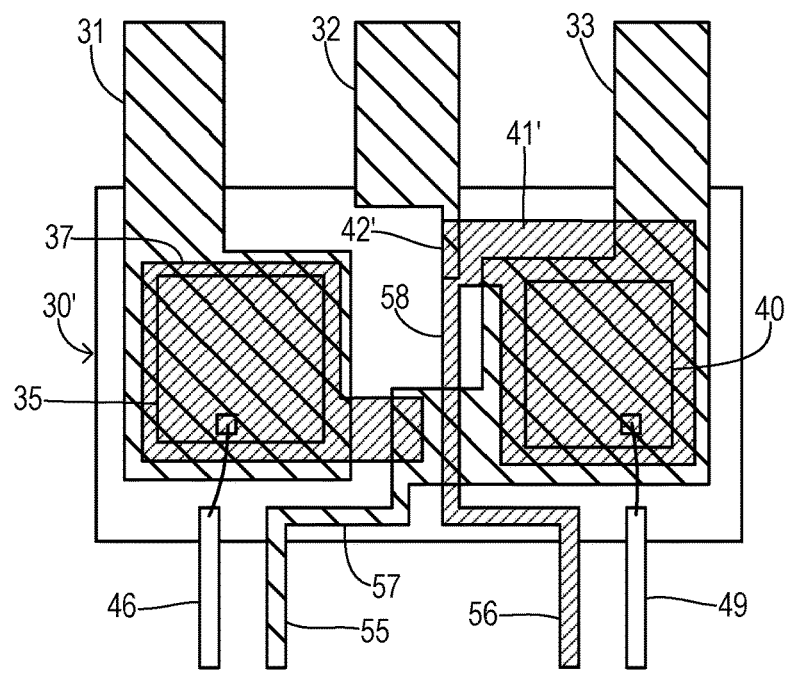
FIG. 5 is a plan view of a transfer-molded power module (TPM) having a pair of IGBTs and an electrode structure for enhancing common source inductance.

The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance. To illustrate, FIG. 4 shows a transfer-molded power module (TPM) configured to have a minimal common source inductance, and FIG. 5 shows modifications that enhance the common source inductance. A molded body 30 carries a plurality of conductive traces or lead frame elements 31, 32, and 33 which extend beyond an edge 34 of body 30 to form power terminals for connecting with the positive bus DC+, the negative bus DC−, and the phase leg output AC, respectively. A first (upper) IGBT 35 is a semiconductor device formed as a die having a collector terminal or pad formed on a bottom surface which is soldered to trace 31. The upper surface of the die provides a gate terminal/pad 36 while the area around pad 36 provides an emitter terminal/pad which is soldered to one end of a bonded lead plate or tab 37. A second end 38 of plate 37 is soldered to trace 33 to connect the emitter of IGBT 35 to the collector of a second (lower) IGBT 40 and to the AC phase leg output. An upper surface of the die of IGBT 40 provides a gate terminal/pad 43 while the area around pad 43 provides an emitter terminal/pad which is soldered to one end of a bonded lead plate or tab 41. A second end 42 of plate 41 is soldered to trace 32 in order to connect the emitter of IGBT 40 to the negative bus DC−. Traces 31-33 and plates 37 and 41 are all electrically insulated from each other and held in place by molded body 30 (which may be comprised of an epoxy resin).

A group of connector pins extend over a second edge 45 of body 30, including gate pins 46 and 48 and Kelvin emitter pins 47 and 49. Bonded jumper wires 50 and 51 connect gate pins 46 and 48 to gate terminals 36 and 43, respectively. Bonded jumper wires 52 and 53 connect Kelvin emitter pins 47 and 49 to the emitter pads of IGBTs 35 and 40, respectively. The Kelvin emitter pins are arranged so that they do not carry (i.e., are perpendicular with) the output currents of the IGBTs, which helps to avoid creating any significant common source inductance. Furthermore, bonded jumper wires 50-53 are kept short so that common source inductance $L_{CSI}$ is low.

FIG. 5 shows one example of a modified electrode structure which enhances (i.e., increases) common source inductance $L_{CSI}$ in a controlled manner, wherein the added $L_{CSI}$ is introduced on the emitter side of the gate drive circuit. Thus, instead of using a typical Kelvin emitter lead placed at a location separate from the bulk of the emitter output current, emitter control pins 55 and 56 for transistors 35 and 40, respectively, are part of an output electrode structure that subjects the emitter control signals to the main output current via trace extensions 57 and 58 that connect emitter pins 55 and 56 to emitter plates 37 and 41' at the location where plates 37 and 41' interconnect with the power terminal sections of traces 32 and 33. The additional length of the output electrode structures for the emitter control signals which connect to the gate drive circuit further increases the added common source inductance $L_{CSI}$. The placement and length of the electrode structures are configurable during circuit design (e.g., design of the lead frame) in order to obtain a desired amount of common source inductance $L_{CSI}$.

Figure 6:
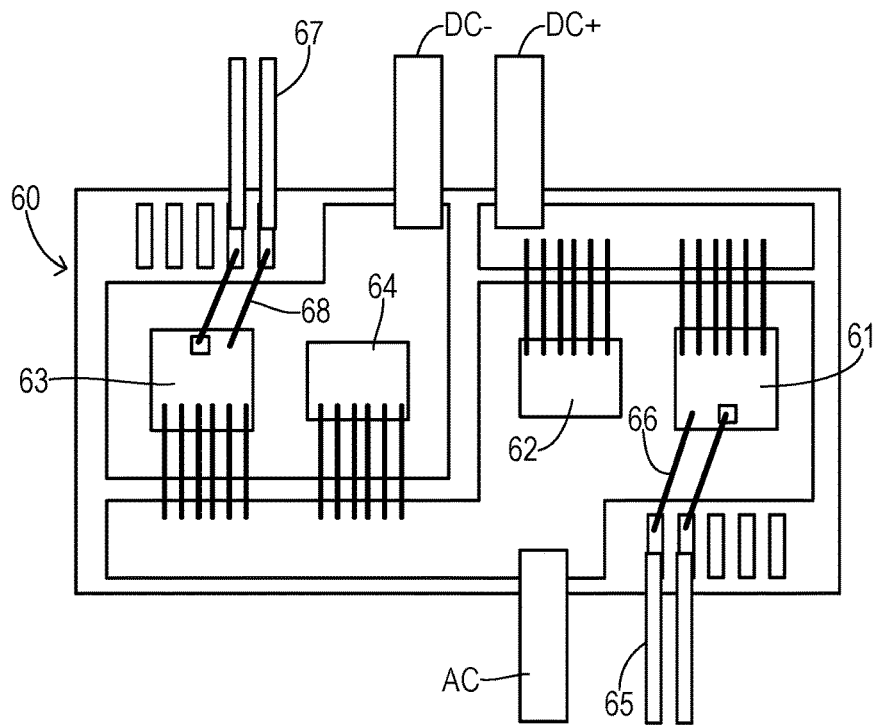
FIG. 6 is a plan view of a direct bonded copper (DBC) power module having a pair of IGBTs and an electrode structure for minimizing common source inductance.
Figure 7:
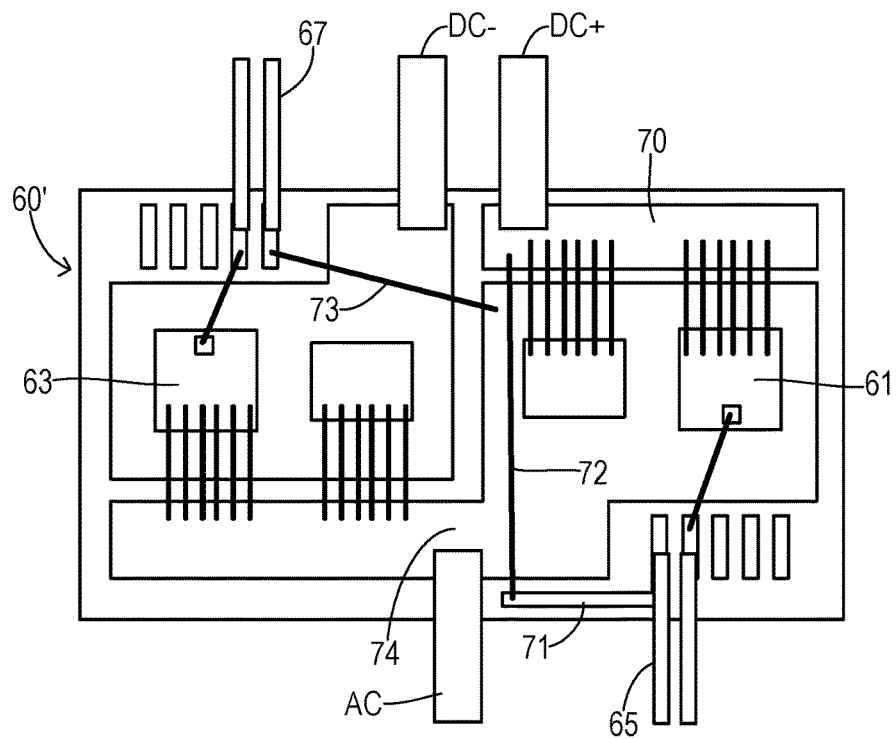
FIG. 7 is a plan view of a direct bonded copper (DBC) power module having a pair of IGBTs and an electrode structure for enhancing common source inductance.

FIG. 6 shows another example of an IGBT power module for an inverter phase leg, wherein a direct bonded copper (DBC) substrate 60 receives an upper IGBT 61, an upper reverse diode 62, a lower IGBT 63, and a lower reverse diode 64. A Kelvin emitter pin 65 is interconnected to an emitter terminal on IGBT 61 via a bonded jumper wire 66 with is distinct from the main emitter output current and has a short length, resulting in a low $L_{CSI}$. Likewise, a Kelvin emitter pin 67 is interconnected to an emitter terminal on IGBT 63 via a bonded jumper wire 68. FIG. 7 shows a modified structure for the emitter output electrodes which enhances $L_{CSI}$ using modifications that subject the emitter control pins 65 and 67 to the main emitter output currents. An extended output electrode structure for pin 65 is formed by a trace 71 and a long bonded jumper wire 72 that connects to a trace (i.e., power strip) 70 where the main emitter output current for IGBT 61 is passed to the positive bus. An extended output electrode structure of pin 67 is formed by a long bonded jumper wire 73 that connects to a conductive trace 74 where the main emitter output current for IGBT 63 is passed to the AC output.

Figure 8:
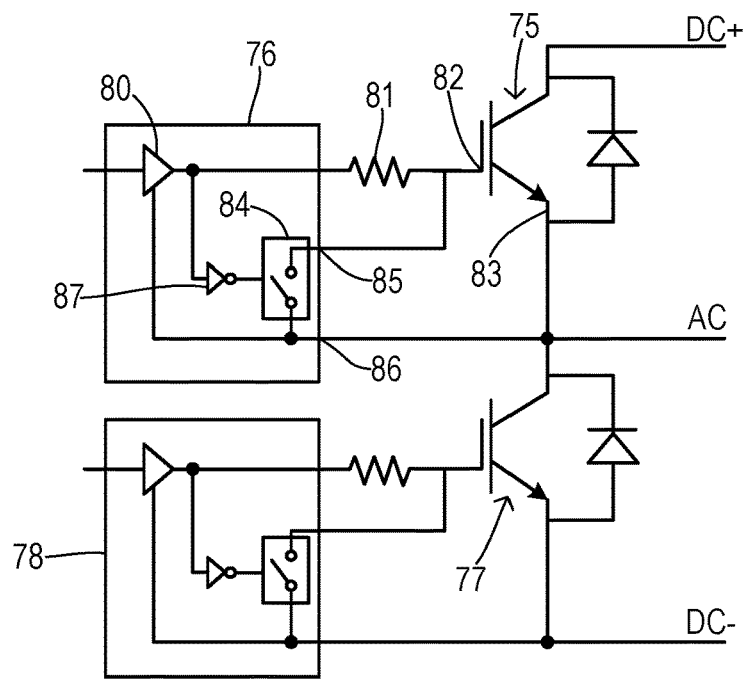
FIG. 8 is a schematic diagram showing a conventional phase leg and gate drive circuit having an active clamping function.

Parasitic inductances (including common source inductance), electrical noise, or other stray voltages have the potential to cause false (i.e., inadvertent) activations of the phase leg switching transistors. To inhibit such activations, active clamping has been used as shown in FIG. 8. The active clamping function is implemented in gate drive circuits 76 and 78 coupled to phase leg switching transistors 75 and 77, respectively. Drive circuits 76 and 78 are typically implemented in an integrated circuit package that accepts switching commands from a PWM controller and generates appropriate signal characteristics to drive the gate terminals of transistors 75 and 77. The drive circuits are identical. Drive circuit 76 and its operation will be described in detail as representative.

An amplifier 80 converts a logic level PWM signal from a controller (not shown) to a gate drive signal that is coupled via a gate resistor 81 to a gate terminal 82 of IGBT 75. An emitter terminal 83 is connected to a reference input of amplifier 80. A clamp 84 within drive circuit 80 is used to tie the transistor's gate to its output to prevent false turn-on whenever clamp 84 is closed. Clamp 84 may be comprised of a MOSFET, for example, with its output terminals available at integrated circuit pins 85 and 86. Pin 85 is connected to gate terminal 82 bypassing gate resistor 81, and pin 86 is connected to the AC output bus. A control input (e.g., gate) of clamp 84 is driven by an inverter/comparator 87 which turns off clamp 84 when amplifier 80 provides a drive signal that turns on transistor 75 and which turns on clamp 84 when amplifier 80 does not provide a drive signal that turns on transistor 75.

Figure 9:
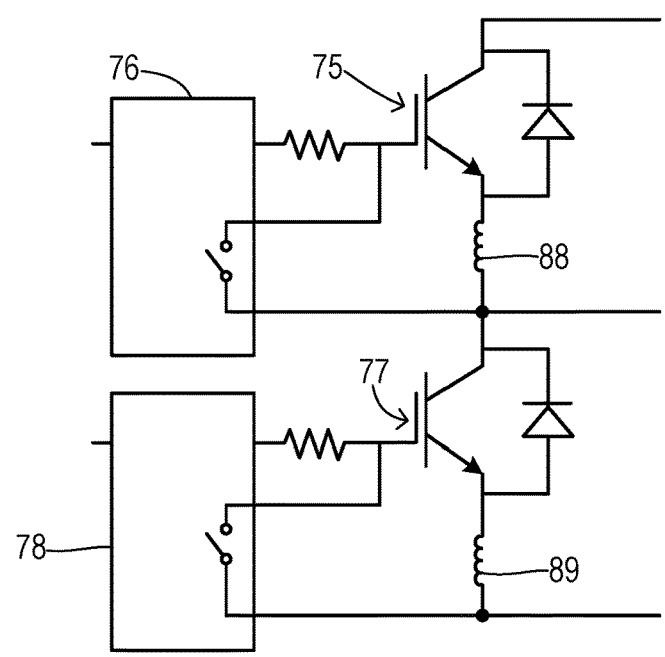
FIG. 9 is a schematic diagram showing a circuit similar to FIG. 8 with an enhanced common source inductance introduced at an emitter side of the IGBTs.

FIG. 9 shows active clamping as in FIG. 8, but with enhanced common source inductances 88 and 89 being added on the emitter sides of phase leg transistors 75 and 77. Thus, even with the active clamps being closed when transistor 75 and/or transistor 77 are intended to be turned off, undesired signals may be coupled to the transistor gate terminals and false turn-on might still occur.

Figure 10:
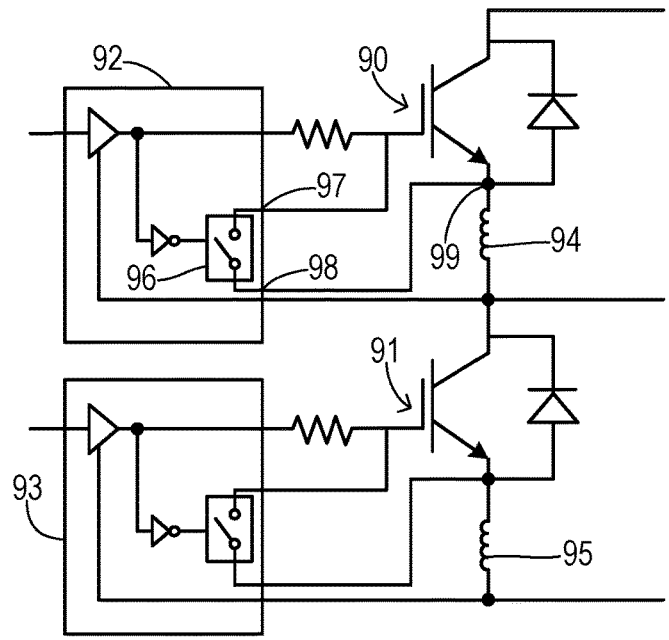
FIG. 10 is a schematic diagram of a phase leg and gate drive circuit according to an embodiment of the invention with an improved active clamping function.

The present invention overcomes such a potential problem by retaining a true Kelvin emitter connection to be used exclusively by the active clamping function as shown in FIG. 10. IGBTs 90 and 91 receive gate drive signals from gate drive circuits 92 and 93, respectively. Emitter output electrodes of IGBTs 90 and 91 are structured to enhance the common source inductance $L_{CSI}$ between their gate and emitter terminals. Each IGBT 90 and 91 has a Kelvin emitter electrode (e.g., Kelvin emitter 99) that substantially bypasses the output electrode structures. Thus, integrated circuit pins 97 and 98 for the outputs of clamp 96 in gate drive circuit 92 are connected to a gate electrode and the Kelvin electrode 99, respectively.

Figure 11:
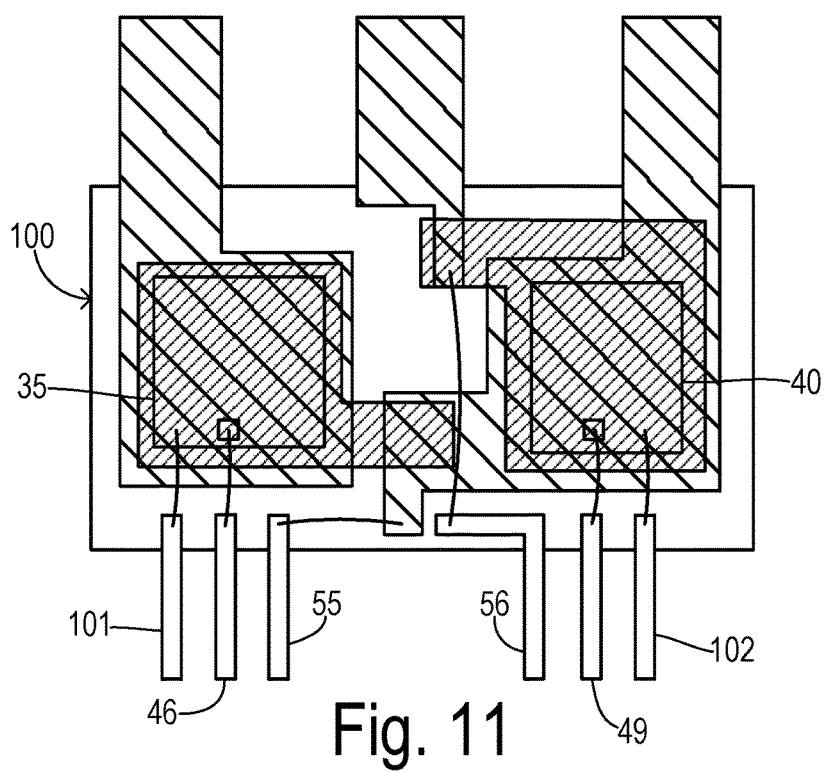
FIG. 11 is a plan view of a transfer-molded power module (TPM) having a pair of IGBTs, an electrode structure for enhancing common source inductance, and a Kelvin emitter electrode for use in active clamping.
Figure 12:
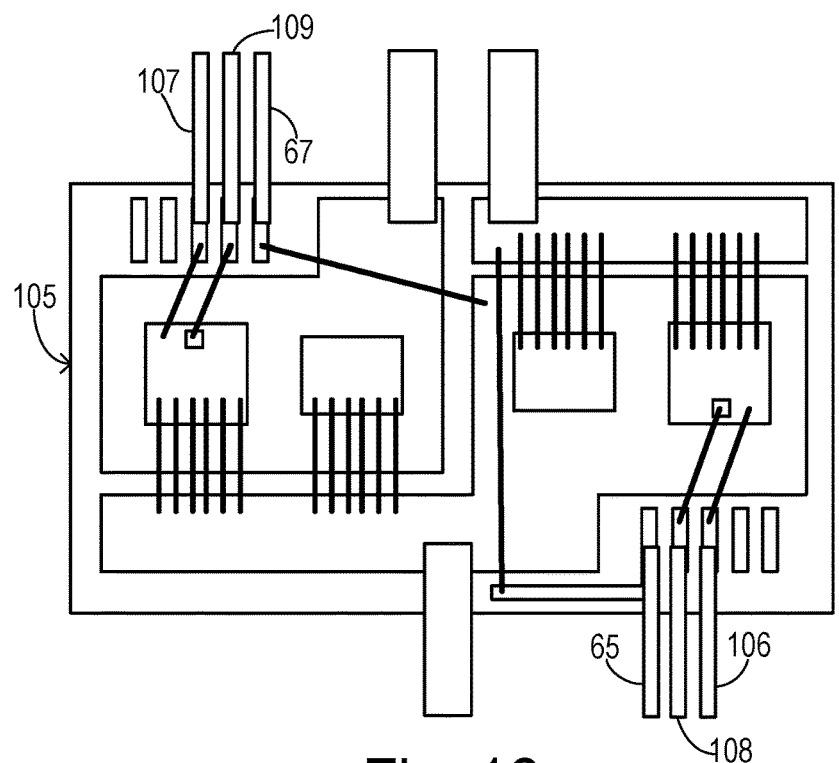
FIG. 12 a plan view of a direct bonded copper (DBC) power module having a pair of IGBTs, an electrode structure for enhancing common source inductance, and a Kelvin emitter electrode for use in active clamping.

FIG. 11 shows a TPM 100 with a layout similar to TPM 30' in FIG. 5, except that both $L_{CSI}$-enhancing emitter output electrodes 55 and 56 and Kelvin emitter electrodes 101 and 102 are provided. Similarly, FIG. 12 shows a DBC substrate 105 with a layout similar to substrate 60' in FIG. 7, except that both $L_{CSI}$-enhancing emitter output electrodes 65 and 67 and Kelvin emitter electrodes 106 and 107 are provided. Gate electrodes 108 and 109 cooperate with Kelvin emitter electrodes 106 and 107 to provide a minimal common source inductance.

Figure 13:
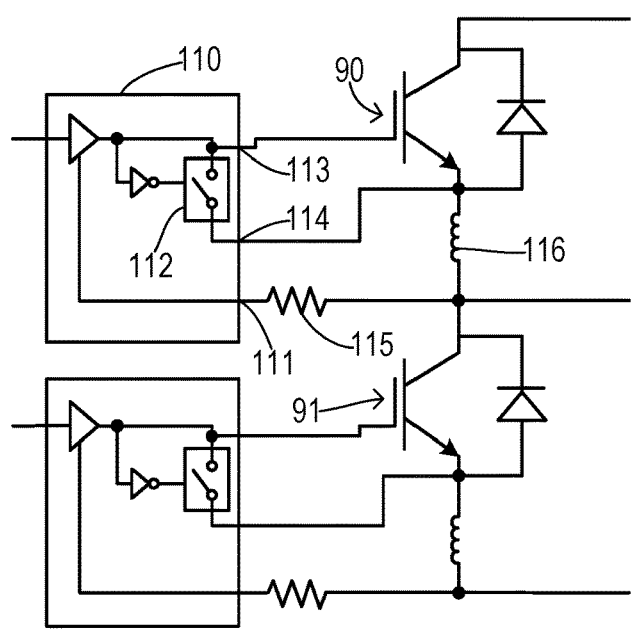
FIG. 13 is a schematic diagram showing another embodiment of the invention wherein a gate resistor is moved to an emitter side in order to reduce a number of I/O pins for the gate drive circuit.

The embodiment of FIG. 10 results in an additional I/O pin being required for the gate drive circuit IC. FIG. 13 shows a further embodiment wherein the gate resistor is relocated to the emitter side of the drive circuit. Thus, a gate resistor 115 is connected between an $L_{CSI}$-enhancing emitter output electrode 115 and a pin 111 of a gate drive circuit 110. Thus, an active clamp 112 can be connected directly to the gate and Kelvin emitter of IGBT 90 via pins 113 and 114. Both the gate drive signals and the active clamping function share access to the gate terminal via pin 113. Since the connections for the active clamp substantially avoid any gate resistances or inductances, reliable clamping is obtained.

FIGS. 14-16 show additional details in regard to a clamping circuit in a driver circuit. In FIG. 14, a driver IC 120 uses a switching device (e.g., MOSFET) 121 to form a clamping switch. A clamping control signal obtained in a manner known in the art is applied to a gate terminal of MOSFET 121. When in the ON state, MOSFET 121 provides rail-to-rail control of the clamping function.

Use of a Kelvin emitter terminal for the clamping function as shown in FIG. 14 greatly reduces noise at the gate of the IGBT. To reduce noise that may appear at the gate of the clamp switching device, an RC filter can be used. For example, a driver IC 122 in FIG. 15 contains a MOSFET 123 connected across the clamping terminals of IC 122. Clamping MOSFET 123 is driven through an RC filter having a capacitor 124 between the gate and emitter terminals of clamping MOSFET 123 and having a resistor 125 coupling the clamping control signal to the gate terminal of MOSFET 123. The components of the clamping function can be implemented "on-chip" within IC 122, or can be implemented using discrete external components. Values of C and R for capacitor 124 and resistor 125, respectively, are selected such that 1) voltage spikes induced at the gate of MOSFET 123 are attenuated enough to avoid false triggering, and 2) the time delay introduced by the R-C circuit is not significant.

It may be desirable to improve gate recovery according to an embodiment shown in FIG. 16. A driver IC 125 contains a MOSFET 126 connected across the clamping terminals. Clamping MOSFET 126 is driven through an RC filter having a capacitor 127 between the gate and emitter terminals of clamping MOSFET 126 and having a resistor 128 coupling the clamping control signal to the gate terminal of MOSFET 126. A diode 130 is connected in parallel with resistor 128. A diode with fast reverse recovery capability and a low junction capacitance should preferably be used.

What is claimed is:

1. An inverter comprising;
a phase leg having series-connected upper and lower transistors adapted to be connected between positive and negative DC buses; and
upper and lower gate drive circuits supplying gate drive signals to the upper and lower transistors, respectively, and each including an active clamp for deactivating the upper and lower transistors, respectively;
wherein the transistors are comprised of semiconductor devices, each having respective gate, source, and emitter terminals;
wherein each emitter terminal is connected to a respective output electrode structured to enhance a common source inductance between the respective gate and emitter terminals;
wherein each emitter terminal is further connected to a respective Kelvin emitter electrode substantially bypassing the respective output electrode; and
wherein each respective active clamp is connected between the respective gate terminal and Kelvin emitter electrode.

2. The inverter of claim 1 further comprising upper and lower gate resistors coupling the gate drive signals between the upper and lower gate drive circuits and the upper and lower transistors, respectively, wherein the active clamp is connected to a junction between the gate terminal and the gate resistor.

3. The inverter of claim 1 further comprising upper and lower gate resistors coupling the gate drive signals between the upper and lower gate drive circuits and the upper and lower transistors, respectively, wherein the gate resistors are connected between the respective output electrode and gate drive circuit, wherein each gate terminal is connected to a respective gate electrode, wherein each gate electrode is directly connected to the respective gate drive circuit to receive the respective gate drive signal and to connect with the respective active clamp.

4. The inverter of claim 1 wherein each Kelvin emitter electrode is comprised of a respective Kelvin emitter pin connected by a respective first bonded wire to a pad for the respective emitter terminal on the respective semiconductor device, and wherein each output electrode is comprised of an emitter control pin connected by a respective second bonded wire to a respective power strip.

5. The inverter of claim 4 wherein the first bonded wires have a length shorter than the second bonded wires.

6. The inverter of claim 1 wherein each respective active clamp is comprised of a MOSFET and an RC filter connected to a gate of the MOSFET.

7. The inverter of claim 6 wherein each respective active clamp further comprises a recovery diode connected across a resistor of the RC filter.

8. A power converter comprising:
a DC link with positive and negative buses configured to receive a DC supply voltage;
a plurality of phase legs in a bridge configuration coupled between the positive and negative buses, each phase leg having series-connected upper and lower transistors with an intermediate junction providing a phase leg output; and
upper and lower gate drive circuits for each phase leg supplying gate drive signals to the upper and lower transistors, respectively, wherein each drive circuit includes an active clamp for deactivating the upper and lower transistors, respectively;
wherein the transistors are comprised of semiconductor devices and each having respective gate, source, and emitter terminals;
wherein each emitter terminal is connected to a respective output electrode structured to enhance a common source inductance between the respective gate and emitter terminals;
wherein each emitter terminal is further connected to a respective Kelvin emitter electrode substantially bypassing the output electrode structure; and
wherein each respective active clamp is connected between the respective gate terminal and Kelvin emitter electrode.

9. The power converter of claim 8 wherein each phase leg further comprises upper and lower gate resistors coupling respective gate drive signals between the upper and lower gate drive circuits and the upper and lower transistors, respectively, wherein each respective active clamp is connected to a respective junction between the respective gate terminal and the gate resistor.

10. The power converter of claim 8 wherein each phase leg further comprises upper and lower gate resistors coupling the gate drive signals between the upper and lower gate drive circuits and the upper and lower transistors, respectively, wherein the gate resistors are connected between the respective output electrode and gate drive circuit, wherein each gate terminal is connected to a respective gate electrode, wherein each gate electrode is directly connected to the respective gate drive circuit to receive the respective gate drive signal and to connect with the respective active clamp.

11. The power converter of claim 8 wherein each Kelvin emitter electrode is comprised of a respective Kelvin emitter pin connected by a respective first bonded wire to a pad for the respective emitter terminal on the respective semiconductor device, and wherein each output electrode is comprised of an emitter control pin connected by a respective second bonded wire to a respective power strip.

12. The power converter of claim 11 wherein the first bonded wires have a length shorter than the second bonded wires.

13. The power converter of claim 8 wherein the transistors are each comprised of an insulated gate bipolar transistor (IGBT).

14. The power converter of claim 8 wherein each respective active clamp is comprised of a MOSFET and an RC filter connected to a gate of the MOSFET.

15. The power converter of claim 14 wherein each respective active clamp further comprises a recovery diode connected across a resistor of the RC filter.

16. An inverter comprising;
a bridge having upper and lower transistors; and
upper and lower gate drive circuits including active clamps for deactivating the transistors;
wherein each transistor has an output electrode structured to enhance a common source inductance of the transistor;
wherein each transistor has a Kelvin emitter electrode substantially bypassing the respective output electrode; and
wherein each active clamp is connected between a gate terminal and Kelvin emitter electrode of the respective transistor.

17. The inverter of claim 16 further comprising upper and lower gate resistors coupling the gate drive signals between the upper and lower gate drive circuits and the upper and lower transistors, respectively, wherein the active clamp is connected to a junction between the gate terminal and the gate resistor.

18. The inverter of claim 16 further comprising upper and lower gate resistors coupling the gate drive signals between the upper and lower gate drive circuits and the upper and lower transistors, respectively, wherein the gate resistors are connected between the respective output electrode and gate drive circuit, wherein each gate terminal is connected to a respective gate electrode, wherein each gate electrode is directly connected to the respective gate drive circuit to receive the respective gate drive signal and to connect with the respective active clamp.

19. The inverter of claim 16 wherein each respective active clamp is comprised of a MOSFET and an RC filter connected to a gate of the MOSFET.

20. The inverter of claim 19 wherein each respective active clamp further comprises a recovery diode connected across a resistor of the RC filter.

* * * * *